United States Patent
McLaurin et al.

(10) Patent No.: US 9,048,847 B2
(45) Date of Patent: Jun. 2, 2015

(54) APPARATUS AND METHODS FOR SYNCHRONIZING PHASE-LOCKED LOOPS

(71) Applicant: Analog Devices Technology, Hamilton (BM)

(72) Inventors: David J McLaurin, Raleigh, NC (US); Christopher W Angell, Cary, NC (US); Michael F Keaveney, Lisnagry (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 65 days.

(21) Appl. No.: 14/034,917

(22) Filed: Sep. 24, 2013

(65) Prior Publication Data

US 2015/0084676 A1 Mar. 26, 2015

(51) Int. Cl.
*H03L 7/00* (2006.01)
*H03L 7/085* (2006.01)
*H03L 7/10* (2006.01)

(52) U.S. Cl.
CPC ............. *H03L 7/085* (2013.01); *H03L 7/104* (2013.01)

(58) Field of Classification Search
USPC ......... 327/142, 146–147, 151, 155, 156, 160, 327/231–234, 241
See application file for complete search history.

(56) References Cited

U.S. PATENT DOCUMENTS

| 6,556,086 B2* | 4/2003 | Keaveney et al. ............. 331/1 A |
| 7,317,360 B2 | 1/2008 | Keaveney |
| 7,463,710 B2* | 12/2008 | Walsh et al. .................. 375/376 |

* cited by examiner

*Primary Examiner* — An Luu
(74) *Attorney, Agent, or Firm* — Knobbe, Martens, Olson & Bear, LLP (57) ABSTRACT

Apparatus and methods for synchronizing phase-locked loops (PLLs) are provided. In certain implementations, a fractional-N synthesizer includes a PLL and a control circuit that controls a division value of the PLL. The control circuit includes an interpolator, a reset phase adjustment calculator, and a synchronization circuit. The interpolator can control a fractional portion of the PLL's division value. The reset phase adjustment calculator can include a counter for counting a number of cycles of the reference clock signal since initialization of the fractional-N synthesizer, and the reset phase adjustment calculator can generate a phase adjustment signal based on the count. The synchronization circuit can synchronize the PLL in response to a synchronization signal, and can correct for a synchronization phase error indicated by the phase adjustment signal.

22 Claims, 5 Drawing Sheets

APPARATUS AND METHODS FOR SYNCHRONIZING PHASE-LOCKED LOOPS

BACKGROUND

1. Field

Embodiments of the invention relate to electronic systems, and more particularly, to synchronization of phase-locked loops (PLLs).

2. Description of the Related Technology

Phase-locked loops (PLLs) can be used in a variety of applications for generating an output clock signal having a controlled phase and frequency relationship to a reference clock signal. PLLs can be used in, for example, telecommunications systems and/or chip-to-chip communication.

An integer-N frequency synthesizer can be implemented using a PLL having an integer frequency divider inserted in the PLL's feedback loop. The integer-N frequency synthesizer can be used to synthesize output frequencies in steps of a reference frequency by selecting an integer division value N of the frequency divider. For example, at steady state, the frequency of the synthesizer's output clock signal should be N times the reference clock signal's frequency. Additionally, in an integer-N frequency synthesizer, at steady state the output clock signal should have N periods for every period of the reference clock signal. Therefore, a rising edge of the reference clock signal can be synchronized with a rising edge of the output clock signal.

To provide finer steps of output frequency adjustment, a fractional-N synthesizer can be used. In contrast to an integer-N frequency synthesizer that uses integer division values, a fractional-N synthesizer permits fractional division values. At steady state, the frequency of the synthesizer's output clock signal should be N+F/M times the reference clock signal's frequency, where N is the integer portion of the division value and F/M is the fractional portion of the division value.

In certain configurations, an interpolator can be used to generate the fractional portion of the division value. For example, the output of the interpolator can include a sequence of integer division values with an average value given by F/M, where F is the numerator of the fractional portion and M is the denominator of the fractional portion.

SUMMARY

In one aspect, an apparatus includes a first phase-locked loop (PLL) configured to receive a reference clock signal and to generate an output clock signal. The first PLL included a programmable divider configured to receive a division signal, and a ratio of a frequency of the output clock signal to a frequency of the reference clock signal changes in relation to the division signal. The apparatus further includes a first control circuit configured to generate the division signal. The first control circuit includes an interpolator configured to generate an interpolated signal based on a fraction numerator signal and based on a modulus signal, and the first control circuit is configured to generate the division signal based on the interpolated signal. The first control circuit further includes a reset phase adjustment calculator configured to generate a phase adjustment signal and to receive an initialization signal. The reset phase adjustment calculator includes a counter configured to count a number of periods of the reference clock signal, and the counter is configured to be reset by the initialization signal. The phase adjustment signal is based on a count of the counter. The first control circuit further includes a synchronization circuit configured to synchronize the first PLL in response to a synchronization signal, wherein the synchronization circuit is configured to correct for a synchronization phase error indicated by the phase adjustment signal.

In another aspect, an electronically implemented method of clock signal generation is provided. The method includes generating an output clock signal based on a reference clock signal using a PLL, resetting a counter using an initialization signal, counting a number of periods of the reference clock signal using the counter, generating a phase adjustment signal based on a count of the counter, controlling a division signal of the PLL using an interpolator, receiving a synchronization signal into a synchronization circuit, synchronizing the PLL in response to a synchronization signal using the synchronization circuit, and correcting for a synchronization phase error indicated by the phase adjustment signal using the synchronization circuit.

DETAILED DESCRIPTION OF EMBODIMENTS

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Fractional-N synthesizers can be desirable for use in a wide variety of electronic systems because they allow relatively small output frequency steps over a wide range of reference clock frequencies. However, absent synchronization, the PLL in a fractional-N synthesizer can lock unpredictably to one of a multitude of possible phases of a reference clock signal.

In certain electronic systems, it can be desirable to synchronize the phase of a PLL's output clock signal to a known relationship with a reference clock signal. For example, in frequency hopping wireless communications systems, a local oscillator may maintain the same phase relationship with the reference clock signal each time the frequency of the local oscillator changes. Furthermore, in multi-PLL systems, it may be important to maintain the same phase relationship between the output clock signals of the PLLs.

Provided herein are apparatus and methods for synchronizing PLLs. In certain implementations, a fractional-N synthesizer includes a PLL and a control circuit that controls a division value of the PLL. The control circuit can include an interpolator, a reset phase adjustment calculator, and a synchronization circuit. The interpolator can be used to control a fractional portion of the division value based on a fraction numerator signal and a fraction denominator or modulus signal. The reset phase adjustment calculator can be used to determine a phase error of the PLL associated with synchronizing the PLL during a particular cycle of the reference clock signal. For example, the reset phase adjustment calculator can include a counter for counting a number of cycles of the reference clock signal since the fractional-N synthesizer was initialized, and the reset phase adjustment calculator can generate a phase adjustment signal based on the count. The synchronization circuit can synchronize the PLL in response to a synchronization signal, and can correct for a synchronization phase error indicated by the phase adjustment signal.

The synchronization circuit can synchronize the PLL and correct for the synchronization phase error in a variety of ways. For example, in certain implementations, the synchronization circuit can reset the interpolator to a known state in response to the synchronization signal, and thereafter adjust a state of the interpolator by an amount indicated by the phase adjustment signal. However, other configurations are possible. For example, in one implementation, the output clock signal of the PLL is provided to a mixer that is in a signal path with a digital phase rotation circuit, and the synchronization circuit can synchronize the PLL by adjusting a state of the digital phase rotation circuit by an amount indicated by the phase adjustment signal. In another implementation, the interpolator is implemented using a sigma delta modulator, and the synchronization phase error is corrected by adjusting a starting value of an integrator of the sigma delta modulator.

The fractional-N synthesizers herein can be synchronized during any arbitrary period of the reference clock signal. In contrast, certain conventional fractional-N synthesizers can provide limited opportunities for synchronization, such as permitting synchronization only after multiple cycles of the reference clock signal. However, such delay may be unacceptable in certain systems. For example, a fractional-N synthesizer using a 1 HZ frequency step may have to wait up to one second between available opportunities for synchronization.

The synchronization schemes herein can also be used to synchronize multiple fractional-N synthesizers such that the output clock signals of the synthesizers have a common phase relationship with respect to a reference clock signal.

In certain configurations, the fractional-N synthesizer's control circuit can also be used to provide a desired phase shift with respect to the reference clock signal. For example, in certain implementations, the reset phase adjustment calculator further includes a phase shift input for controlling a phase shift of the PLL's output clock signal relative to the reference clock signal. For example, the phase adjustment signal can be based on a sum of a phase shift signal indicating a desired phase shift and a phase error associated with synchronizing the PLL during a particular reference clock signal period.

Furthermore, in certain implementations, a fractional-N synthesizer can remain synchronized with respect to the reference clock signal even after the PLL has been disabled or locked to a different frequency. For example, in certain implementations, the counter in the synthesizer's reset phase adjustment calculator can remain enabled and can continue to count even when the PLL and/or other circuitry of the fractional-N synthesizer is disabled. Subsequently when the PLL is enabled, the reset phase adjustment calculator can be used to generate a phase adjustment signal which can be used to synchronize the PLL's output clock signal with the reference clock signal.

Figure 1:
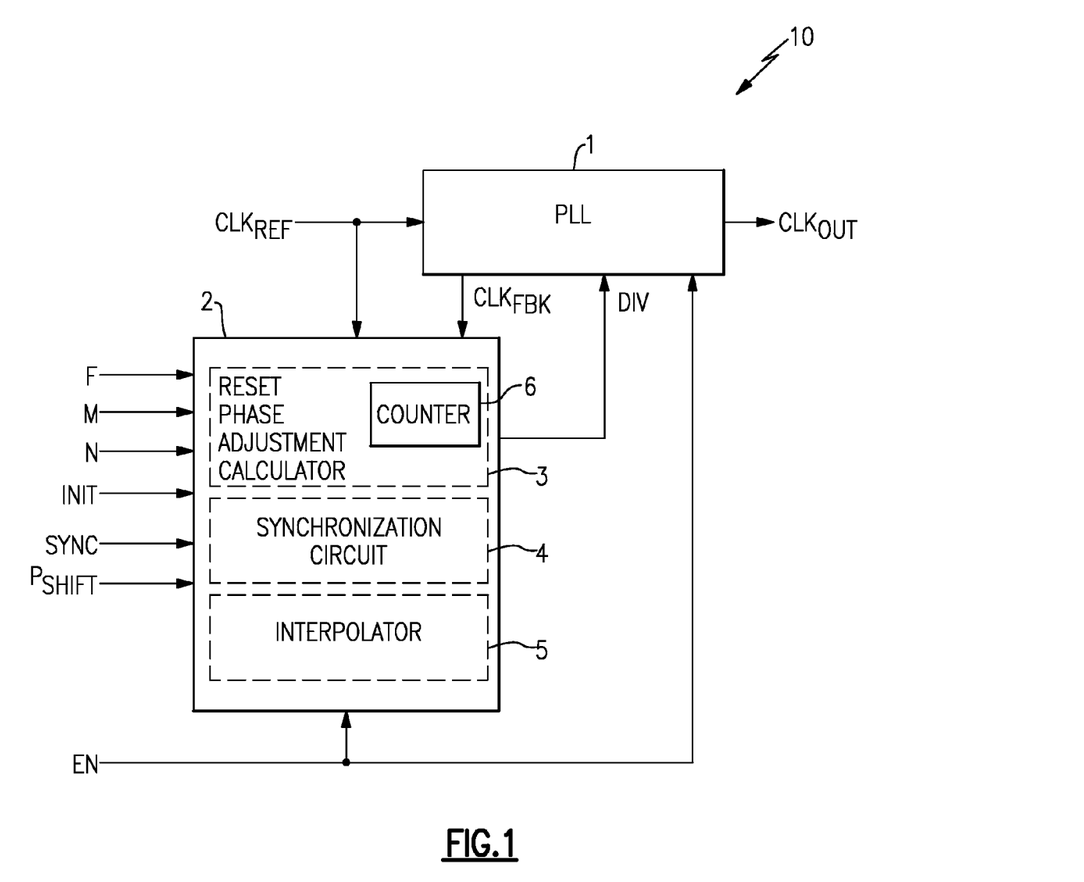
FIG. 1 is a schematic block diagram of one embodiment of a fractional-N synthesizer.

FIG. 1 is a schematic block diagram of one embodiment of a fractional-N synthesizer 10. The fractional-N synthesizer 10 includes a PLL 1 and a control circuit 2.

The PLL 1 generates an output clock signal $CLK_{OUT}$ and receives a reference clock signal $CLK_{REF}$, an enable signal EN, and a division signal DIV. The PLL 1 can divide the output clock signal $CLK_{OUT}$ based on the division signal DIV to generate a feedback clock signal $CLK_{FBK}$. The PLL 1 can generate an error signal by comparing the feedback clock signal $CLK_{FBK}$ to the reference clock signal $CLK_{REF}$, and the error signal can be used to control a frequency of the output clock signal $CLK_{OUT}$.

In the illustrated configuration, the control circuit 2 receives the reference clock signal $CLK_{REF}$, a fraction numerator signal F, a fraction denominator or modulus signal M, an integer division signal N, an initialization signal INIT, a synchronization signal SYNC, a phase shift signal $P_{SHIFT}$, and an enable signal EN. The control circuit 2 includes a reset phase adjustment calculator 3, a synchronization circuit 4, and a fractional interpolator 5. The reset phase adjustment calculator 3 includes a counter 6.

The fractional-N synthesizer 10 can be used to control the frequency of the output clock signal $CLK_{OUT}$ to be about N+F/M times the frequency of the reference clock signal $CLK_{REF}$, where N is the value of the integer division signal N, F is the value of the fraction numerator signal F, and M is the value of the modulus signal M.

The interpolator 5 can be used to generate an interpolated signal corresponding to a fractional portion of the division signal DIV. For example, the interpolated signal can be added to the integer division signal N to generate the division signal DIV. In certain implementations, the division signal DIV has an integer value which changes over time to provide an average division value indicated by the fraction numerator signal F, the modulus signal M, and the integer division signal N. For instance, to achieve a division rate of 11.5, the division signal DIV can have a value of 11 for one-half of the time and a value of 12 for one-half of the time.

In one embodiment, the interpolator 5 includes a sigma delta modulator. Using a sigma delta modulator for interpolation can reduce or remove frequency sidebands or spurs relative to an interpolator whose output periodically alternates between two states. For example, the output of the sigma delta modulator can change relatively frequently, thereby shifting noise associated with interpolation to a relatively high frequency where it can be filtered by the PLL 1.

As shown in FIG. 1, in certain implementations the feedback clock signal $CLK_{FBK}$ can be provided to the control circuit 2 to aid in controlling the PLL 1. For example, in one implementation, the feedback clock signal $CLK_{FBK}$ clocks at least a portion of the state elements of the interpolator 5, such that the timing of the interpolator 5 is controlled by the feedback clock signal $CLK_{FBK}$.

The control circuit 2 receives the initialization signal INIT, which can be used to initialize the control circuit 2 to a known state. In certain implementations, the initialization signal INIT is used to reset a count of the counter 6, such as to a count value of 0. Thereafter, the counter 6 can count a number of cycles of the reference clock signal $CLK_{REF}$ since initialization of the fractional-N synthesizer 10. Additionally, the reset phase adjustment calculator 3 can use the count signal generated by the counter 6 to generate a phase adjustment signal indicating a phase error that would be associated with synchronizing the PLL 1 on a particular cycle of the reference clock signal $CLK_{REF}$.

Additionally, as shown in FIG. 1, the control circuit 2 receives the synchronization signal SYNC. In response to activation of the synchronization signal SYNC, the synchronization circuit 4 can synchronize the PLL 1. For example, in certain implementations, the synchronization circuit 4 can reset the interpolator 5 in response to the synchronization signal SYNC. Additionally, the synchronization circuit 4 can adjust a state of the interpolator 5 by an amount indicated by the phase adjustment signal, thereby correcting the output phase of the PLL 1 to account for the phase error associated with synchronizing the PLL 1 during a particular period of the reference clock signal $CLK_{REF}$.

The illustrated control circuit 2 can be used to synchronize the fractional-N synthesizer's PLL during an arbitrary period of the reference clock signal $CLK_{REF}$. In contrast, certain conventional fractional-N synthesizers can provide limited opportunities for synchronization, such as requiring synchronization after multiple cycles of the reference clock signal $CLK_{REF}$.

In the illustrated configuration, the control circuit 2 receives the phase shift signal $P_{SHIFT}$, which can be used to provide a desired phase shift between the output clock signal $CLK_{OUT}$ and the reference clock signal $CLK_{REF}$. In certain configurations, the reset phase adjustment calculator 3 generates the phase adjustment signal by adding the phase shift signal $P_{SHIFT}$ to a phase error signal associated with synchronizing the PLL on a particular cycle. Thus, when the synchronization circuit 4 resets the interpolator 5, the phase of the output clock signal $CLK_{OUT}$ can be adjusted to account for both a phase error associated with synchronization and a phase shift indicated by the phase shift signal $P_{SHIFT}$.

The fractional-N synthesizer 10 can be configured to maintain synchronization even when the PLL 1 has been disabled or locked to a different frequency. For example, in certain configurations, the fractional-N synthesizer 10 can receive the enable signal EN, which can be used to disable various circuits of the fractional-N synthesizer, including, for example, portions of the control circuit 2 and/or PLL 1, such as the PLL's oscillator, phase detector, and/or divider. However, in certain implementations, the counter 6 of the reset phase adjustment calculator 3 can remain enabled and can continue to count even when the PLL 1 and/or other portions of the control circuit 2 are disabled. Thereafter, the enable signal EN can be asserted, and the reset phase adjustment calculator 3 can be used to generate a phase adjustment signal based on the count of the counter 6. When the synchronization signal SYNC is asserted, the synchronization circuit 4 can be used to reset the interpolator 5 and adjust the interpolator's state to account for a phase error associated with synchronizing the fractional-N synthesizer 10 on a particular cycle of the reference clock signal $CLK_{REF}$.

Figure 2:
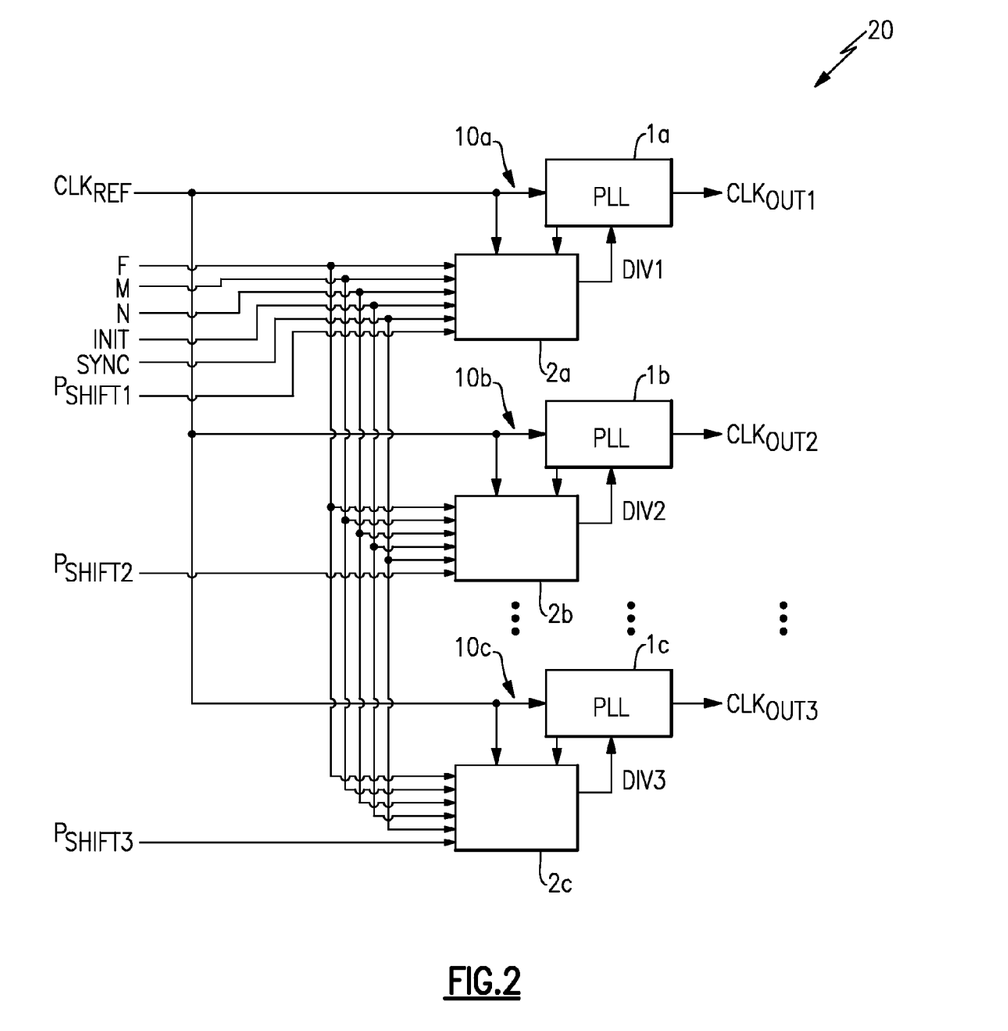
FIG. 2 is a schematic block diagram of one embodiment of a clock synthesis system including a plurality of fractional-N synthesizers.

FIG. 2 is a schematic block diagram of one embodiment of a clock synthesis system 20 including a plurality of fractional-N synthesizers 10a, 10b, 10c.

The first fractional-N synthesizer 10a includes a first PLL 1a and a first control circuit 2a. Additionally, the second fractional-N synthesizer 10b includes a second PLL 1b and a second control circuit 2b. Furthermore, the third fractional-N synthesizer 10c includes a third PLL 1c and a third control circuit 2c.

Although the clock synthesis system 20 is illustrated as including three clock synthesizers, the clock synthesis system 20 can be adapted to include more or fewer synthesizers. In certain configurations, the first, second and third fractional-N synthesizers 10a-10c are disposed on separate integrated circuits (ICs).

In the illustrated configuration, the first, second and third fractional-N synthesizers 10a-10c each receive the reference clock signal $CLK_{REF}$, the fraction numerator signal F, the modulus signal M, the integer division signal N, the initialization signal INIT, and the synchronization signal SYNC. Additionally, the first fractional-N synthesizer 10a has been configured to receive a first phase shift signal $P_{SHIFT1}$, the second fractional-N synthesizer 10b has been configured to receive a second phase shift signal $P_{SHIFT2}$, and the third fractional-N synthesizer 10c has been configured to receive a third phase shift signal $P_{SHIFT3}$. Furthermore, the first, second and third fractional-N synthesizers 10a-10c have been configured to generate different output clock signals. For example, the first fractional-N synthesizer 10a generates a first output clock signal $CLK_{OUT1}$, the second fractional-N synthesizer 10b generates a second output clock signal $CLK_{OUT2}$, and the third fractional-N synthesizer 10c generates a third output clock signal $CLK_{OUT3}$.

Even when the phase shift signals $P_{SHIFT1}$-$P_{SHIFT3}$ have the same value, absent synchronization, the first, second, and third fractional-N synthesizers 10a-10c can have output clock signals locked to different phases of the reference clock signal $CLK_{REF}$.

The illustrated configuration can be used to synchronize the first, second, and third fractional-N synthesizers 10a-10c to a common output phase with respect to the reference clock signal $CLK_{REF}$.

For example, the first, second and third fractional-N synthesizers 10a-10c each receive the initialization signal INIT. In a manner similar to that described earlier with respect to FIG. 1, the initialization signal INIT can be used to initialize or reset an initial state of counters associated with the synthesizers' reset phase adjustment calculators.

Thereafter, when the synchronization signal SYNC is asserted, the output phase of the PLLs 1a-1c can be corrected based on the count values to account for a phase error associated with synchronizing the synthesizers on a particular reference clock cycle. In certain implementations, the synchronization signal can be applied to the fractional-N synthesizers 10a-10c at different times, such as during different cycles of the reference clock signal $CLK_{REF}$. After the PLLs 1a-1c have been synchronized using the control circuits 2a-2c, respectively, the PLLs 1a-1c can have about the same output phase relative to one another when the phase shift signals $P_{SHIFT1}$-$P_{SHIFT3}$ have the same value. For example, the control circuits 2a-2c can include counters that can be reset to a known value during initialization, and thereafter the state of the interpolators can be adjusted based on a count of the control circuit's counters.

Additional details of the fractional-N synthesizers 10a-10c can be as described earlier.

Although FIG. 2 illustrates one configuration of a clock synthesis system including multiple fractional-N synthesizers, other configurations are possible. For example, in certain implementations, portions of the control circuits 2a-2c can be shared amongst the synthesizers. Furthermore, in certain implementations, the synthesizers can receive separate control signals, including, for example, separate synchronization signals and/or enable signals. Furthermore, although FIG. 2 shows a configuration in which the first, second, and third fractional-N synthesizers 10a-10c receive different phase shift signals, the teachings herein are applicable to configuration in which the fractional-N synthesizers receive the same phase signal or configurations in which phase shift signals are omitted.

Figure 3:
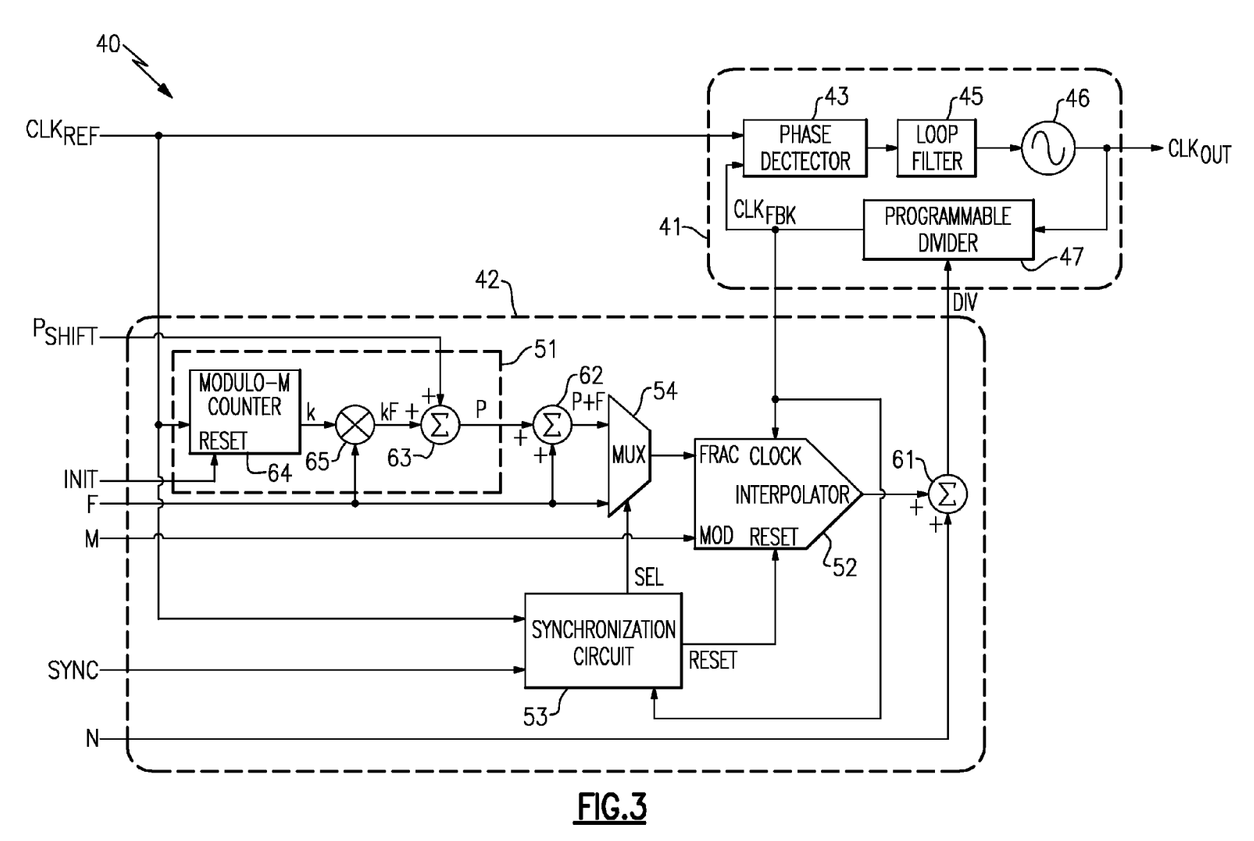
FIG. 3 is a schematic block diagram of another embodiment of a fractional-N synthesizer.

FIG. 3 is a schematic block diagram of one embodiment of a fractional-N synthesizer 40. The fractional-N synthesizer 40 includes a PLL 41 and a control circuit 42. The fractional-N synthesizer 40 generates the output clock signal $CLK_{OUT}$ and receives the reference clock signal $CLK_{REF}$, the fraction numerator signal F, the modulus signal M, the integer division signal N, the initialization signal INIT, the phase shift signal $P_{SHIFT}$, and the synchronization signal SYNC.

The PLL 41 includes a phase detector 43, a loop filter 45, a voltage controlled oscillator 46, and a programmable divider 47. The phase detector 43 includes a first input for receiving the reference clock signal $CLK_{REF}$ and a second input for receiving a feedback clock signal $CLK_{FBK}$. The phase detector 43 further includes an output electrically connected to an input of the loop filter 45. The loop filter 45 includes an output electrically connected to an input of the VCO 46. The VCO 46 further includes an output for generating the output clock signal $CLK_{OUT}$. The programmable divider 47 includes an input for receiving the output clock signal $CLK_{OUT}$, an output for generating the feedback clock signal $CLK_{FBK}$, and a control input for receiving a division signal DIV from the control circuit 42.

The phase detector 43 can include circuitry configured to generate an error signal based on a phase difference and/or frequency difference between the reference clock signal $CLK_{REF}$ and the feedback clock signal $CLK_{FBK}$. Additionally, the phase detector 43 can include charge pump circuitry that can control a flow of current into or out of the input of the loop filter 45 based on the error signal. Although one example implementation of the phase detector 43 has been described, the phase detector 43 can be implemented using a variety of configurations.

The loop filter 45 can be any suitable PLL loop filter, including for example, an active loop filter or a passive loop filter. The loop filter 45 can be used for a variety of purposes, such as to maintain the stability of the PLL 41.

The VCO 46 can be implemented using a variety of oscillator configurations, including, for example, an inductor-capacitor (LC) tank oscillator implementation or a rotary travelling wave oscillator (RTWO) implementation. For example, an RTWO is described in U.S. Pat. No. 6,556,089, which is incorporated by reference herein. Although two examples of VCOs have been provided, other configurations can be used.

The programmable divider 47 receives the division signal DIV, and can divide the output clock signal $CLK_{OUT}$ by a division rate indicated by the division signal DIV to generate the feedback clock signal $CLK_{FBK}$. In certain implementations, the programmable divider 47 is an integer divider, and the division signal DIV has an integer value that changes over time to achieve the desired fractional division rate.

Although FIG. 3 illustrates one configuration of a PLL, the teachings herein are applicable to other PLL implementations. For example, the PLL 41 can be adapted to include additional structures, such as additional dividers, filters and/or other circuitry.

The control circuit 42 includes a reset phase adjustment calculator or calculation circuit 51, an interpolator 52, a synchronization circuit 53, a multiplexer 54, a first adder 61, and a second adder 62. The reset phase adjustment calculation circuit 51 includes a third adder 63, a modulo-M counter 64, and a multiplier 65.

The modulo-M counter 64 includes a clock input for receiving the reference clock signal $CLK_{REF}$, a reset input for receiving the initialization signal INIT, and an output for generating a count value k. The multiplier 65 includes a first input for receiving the count value k, a second input for receiving the fraction numerator signal F, and an output for generating a multiplied signal kF. The third adder 63 includes a first input for receiving a phase shift signal $P_{SHIFT}$, a second input for receiving the multiplied signal kF, and an output for generating a phase adjustment signal P, which can have a value $P_{SHIFT}+kF$ corresponding to a sum of the phase shift signal $P_{SHIFT}$ and the multiplied signal kF.

The second adder 62 includes a first input for receiving the phase adjustment signal P, a second input for receiving the fraction numerator signal F, and an output for generating an adjusted fraction numerator signal P+F, which can have a value corresponding to a sum of the phase adjustment signal P and the fraction numerator signal F. The multiplexer 54 includes a first input for receiving the adjusted fraction numerator signal P+F, a second input for receiving the fraction numerator signal F, a selection control input for receiving a selection control signal SEL, and an output for generating a selected signal. The synchronization circuit 53 includes a first clock input for receiving the reference clock signal $CLK_{REF}$, a second clock input for receiving the feedback clock signal $CLK_{FBK}$, a synchronization input for receiving the synchronization signal SYNC, a first output for generating the selection control signal SEL, and a second output for generating a reset signal RESET.

The interpolator 52 includes a fractional input for receiving the selected signal from the multiplexer 54, a modulus input for receiving the modulus signal M, a clock input for receiving the feedback clock $CLK_{FBK}$, a reset input for receiving the reset signal RESET, and an output for generating an interpolated signal corresponding to a fractional portion of the PLL's divisional signal DIV. In certain implementations, the interpolated signal generated by the interpolator 52 is an integer, but has an average value determined by the ratio of the signals received at the interpolator's fraction numerator input and modulus input. In one embodiment, the interpolator includes a sigma delta modulator.

The first adder 61 includes a first input for receiving the interpolated signal from the interpolator 52, a second input for receiving the integer division signal N, and an output for generating the PLL's division signal DIV.

The illustrated control circuit 42 can be used to generate a division signal DIV for the PLL 41. Additionally, the control circuit 42 receives a synchronization signal SYNC that can synchronize the phase of the output clock signal $CLK_{OUT}$ to a known relationship with the reference clock signal $CLK_{REF}$. In one embodiment, the control circuit 42 can control the output clock signal $CLK_{OUT}$ to have a phase difference with the reference clock signal $CLK_{REF}$ that is about equal to the known phase relationship plus the phase shift signal $P_{SHIFT}$.

As will be described in detail below, the control circuit 42 permits synchronization during any cycle of the reference clock signal $CLK_{REF}$. In contrast, certain conventional synchronization circuits provide limited opportunities for synchronization, such as requiring synchronization after a certain number of cycles of the reference clock signal $CLK_{REF}$.

During normal operation of the fractional-N synthesizer 40 when the fractional-N synthesizer 40 is not being synchronized, the select signal SEL can control the multiplexer 54 such that the interpolator 52 receives the fraction numerator signal F as an input. Thus, the interpolator 52 can generate the interpolated signal based on an interpolation of the fraction numerator signal F and the modulus signal M.

However, in response to activation of the synchronization signal SYNC, the synchronization circuit 53 can reset the interpolator 52 to a known state. Additionally, the synchronization circuit 53 can use the select signal SEL to control the multiplexer 54 to provide the adjusted fraction numerator signal P+F to the interpolator 52. Configuring the synchronization circuit 53 in this manner can operate to set the phase of the PLL 41 to a known value and to adjust for a synchronization phase error associated with synchronizing the PLL 41 in a particular cycle of the reference clock signal $CLK_{REF}$. Thus, the synchronization circuit 53 can provide phase adjustment to permit the PLL 41 to be synchronized during any period of the reference clock signal $CLK_{REF}$.

Although the illustrated configuration provides phase adjustment by providing the adjusted fractional numerator signal P+F to the interpolator 52 for a single clock cycle, other configurations are possible. For example, in one embodiment, a phase adjustment of P/j+F is provided to the interpolator 52 for j periods of the reference clock signal $CLK_{REF}$. Configuring a control circuit to provide phase adjustment in this manner can increase phase adjustment resolution by a factor of j. In another embodiment, phase adjustment is provided using a phase adjustment signal having two or more different values across multiple clock cycles, and the amount of phase adjustment is based on a sum of the phase adjustment signal values.

In the illustrated configuration, the synchronization circuit 53 receives the feedback clock signal $CLK_{FBK}$. In certain implementations, the synchronization circuit 53 can use the feedback clock signal $CLK_{FBK}$ to re-time select signal SEL and/or the reset signal RESET. However, other configurations are possible.

The fractional-N synthesizer 40 can be used to control the frequency of the output clock signal $CLK_{OUT}$ based on the frequency of the reference clock signal $CLK_{REF}$. For example, the output frequency $f_{out}$ of the output clock signal $CLK_{OUT}$ can be given by Equation 1 below, where $f_{ref}$ is the frequency of the reference clock signal $CLK_{OUT}$, M is the value of the modulus signal M, N is the value of the integer division signal N, and F is the value of the fraction numerator signal F.

$$f_{out} = f_{ref}(N+F/M) \quad \text{Equation 1}$$

Since N, F, and M are integers, the phase of the output clock signal $CLK_{OUT}$ can align with one out of X edges of the reference clock $CLK_{REF}$, where X is the least common multiple of F and M. Absent synchronization, the output clock signal $CLK_{OUT}$ can lock to the reference clock signal $CLK_{REF}$ in multiple different ways.

When the reference clock signal $CLK_{REF}$ is sinusoidal, the normalized voltage of the reference clock signal $CLK_{REF}$ versus time can be given by Equation 2 below, where $\pi$ is the mathematic constant pi and where $\phi_{ref}$ is the phase of the reference clock signal $CLK_{REF}$.

$$V_{ref}(t) = \cos(2\pi f_{ref} t + \phi_{ref}) \quad \text{Equation 2}$$

Additionally, when the fractional interpolator is reset at time t=0, the output clock signal $CLK_{OUT}$ of the PLL 41 can have a phase $\phi_{rel}$ relative to the reference clock signal $CLK_{REF}$. If the interpolator 52 is reset at an arbitrary time $t_{reset}$, the normalized voltage of the output clock signal $CLK_{OUT}$ can be given by Equation 3 below.

$$V_{out}(t) = \cos(2\pi f_{out}(t - t_{reset}) + \phi_{ref} + \phi_{rel}) \quad \text{Equation 3}$$

When the reset time $t_{reset}$ is limited to an integer number of periods of the reference clock signal $CLK_{REF}$, then $t_{reset}$ can be equal to $K/f_{ref}$, where K is an integer. Thus the normalized voltage of the output clock signal $CLK_{OUT}$ can be given by Equation 4 below, where the desired output phase $\phi_{desired} = \phi_{ref} + \phi_{rel}$.

$$V_{out}(t) = \cos\left(2\pi f_{out}\left(t - \frac{K}{f_{ref}}\right) + \phi_{desired}\right) \quad \text{Equation 4}$$

Substituting Equation 1 into Equation 4 and rearranging terms yields Equation 5 below.

$$V_{out}(t) = \cos\left(2\pi f_{ref}\left(N + \frac{F}{M}\right) + -2\pi K\left(N + \frac{F}{M}\right) + \varphi_{desired}\right) \quad \text{Equation 5}$$

Since a sinusoid can be represented by $\cos(2\pi \ast f \ast t + \phi)$, the output phase of the output clock signal $CLK_{OUT}$ can be given by Equation 6 below.

$$\text{Output Phase} = -2\pi K\left(N + \frac{F}{M}\right) + \varphi_{desired} \quad \text{Equation 6}$$

Since adding an integer multiple of $2\pi$ does not change the phase of a sinusoidal signal, and since K, F, M, and N are integers, Equation 6 can be reduced to Equation 7 below.

$$\text{Output Phase} = -2\pi K \frac{F}{M} + \varphi_{desired} \quad \text{Equation 7}$$

When KF/M is an integer, the output clock signal $CLK_{OUT}$ can have the desired phase $\phi_{desired}$ and an opportunity for synchronizing the output clock signal $CLK_{OUT}$ to the reference clock signal $CLK_{REF}$ can be present. In general, this condition can occur only every K=n*M periods of the reference clock signal $CLK_{REF}$, where n is an integer. Thus, permitting resets only when this condition is true can limit opportunities for synchronizing the PLL 41 to only about every $n \ast M/f_{ref}$ seconds. For instance, in a fractional-N PLL where the output clock $CLK_{OUT}$ has a frequency that can be controlled in steps of about 1 Hz, opportunities to synchronize the PLL 41 can be separated by as long as about one second.

The reset phase adjustment calculation circuit 51 can be used to permit synchronization of the PLL 41 during any period of the reference clock signal $CLK_{REF}$. For example, when K is not equal to n*M, the value of K can be given by Equation 8 below, where k is an integer.

$$K = nM + k \quad \text{Equation 8}$$

Thus, by substituting Equation 8 into Equation 6 above and removing integer multiples of $2\pi$, the output phase of the output clock signal $CLK_{OUT}$ in this condition can be given by Equation 9 below.

$$\text{Output Phase} = -2\pi \frac{kF}{M} + \varphi_{desired} \quad \text{Equation 9}$$

The phase error due to synchronizing during a reference period where k is not equal to zero is then given by Equation 10 below.

$$\Delta \varphi = -2\pi k \frac{F}{M} \quad \text{Equation 10}$$

The illustrated control circuit 42 permits synchronization of the PLL 41 during any period of the reference clock signal $CLK_{REF}$ by keeping count of the number of periods of the reference clock signal $CLK_{REF}$ since the fractional-N synthesizer 40 was initialized. Additionally, when synchronization occurs, the control circuit 42 corrects for the phase error associated with synchronizing during an arbitrary period of the reference clock signal $CLK_{REF}$.

For example, when the PLL 41 is being synchronized, the synchronization circuit 53 can reset the interpolator 52 to a known state. Thereafter, the fraction numerator input of the interpolator 52 is switched from the fraction numerator signal F to the adjusted fraction numerator signal P+F for a cycle of the reference clock signal $CLK_{REF}$. Configuring the interpolator 52 in this manner increments the phase of the PLL 41 by about $2\pi*P/M$ radians. In certain implementations, the synchronization circuit 53 provides the adjusted fraction numerator signal P+F to the interpolator 52 one clock cycle after resetting the interpolator 52 to a known state. However, other configurations are possible. For example, in one implementation, the adjusted fraction numerator signal P+F is provided to the interpolator 52 two or more clock cycles after resetting the interpolator 52. Configuring the synchronization circuit 53 in this manner can permit pipelining of the phase adjustment calculation by the reset phase adjustment calculation circuit 51, which may increase a maximum frequency of the reference clock signal $CLK_{REF}$ that the fractional-N synthesizer 40 can support.

To account for the phase error $\Delta\phi$ given in Equation 10, the reset phase adjustment calculation circuit 51 can generate a phase adjustment equal to about $-kF$. Furthermore, to provide an additional phase shift or adjustment $\phi_{shift}$ in radians, the reset phase adjustment calculation circuit 51 can generate the phase adjustment signal P to have a value given by Equation 11 below.

$$P = kF + M\frac{\varphi_{shift}}{2\pi} \quad \text{Equation 11}$$

As shown in FIG. 3, the modulo-M counter 64 can be used to count a number of reference periods of the reference clock signal $CLK_{REF}$ since the fractional-N synthesizer 40 was initialized using the initialization signal INIT. Additionally, the modulo-M counter 64 can output the count signal k as a result. The multiplier 65 can be used to multiply the count signal k by the fraction numerator signal F to generate the multiplied signal kF. Furthermore, the third adder 63 can be used to add the multiplied signal kF and the phase shift signal $P_{SHIFT}$ to generate the phase adjustment signal P. In certain configurations, the phase shift signal $P_{SHIFT}$ can have a value equal to about $M*\phi_{shift}/2\pi$, where $\phi_{shift}$ corresponds to any additional phase shift in radians.

To initialize the fractional-N synthesizer 40, the initialization signal INIT can be asserted. The initialization signal INIT can reset a count of the modulo-M counter 64. After initialization, the modulo-M counter 64 can count a number of periods of the reference clock signal $CLK_{REF}$ to generate the count signal k, which can be used to generate the phase adjustment signal P.

Later, during an arbitrary period of the reference clock signal $CLK_{REF}$, the synchronization signal SYNC can be asserted. The synchronization circuit 53 can use the synchronization signal SYNC to reset the interpolator 52. Thereafter, the synchronization circuit 53 can control the multiplexer 54 using the select signal SEL so that the multiplexer 54 passes the adjusted fraction numerator signal P+F to the interpolator's fractional input for one period, or by using other configurations, such as providing a phase adjustment of P/j+F for j periods. The phase of the output clock signal $CLK_{OUT}$ will then be synchronized to the reference clock signal $CLK_{REF}$ with any phase shift indicated by the phase shift signal $P_{SHIFT}$.

When multiple PLLs are synchronized, all of the PLLs can be initialized during the same period of the reference clock signal $CLK_{REF}$. Thereafter, the PLLs can be synchronized using a synchronization signal on the same or different periods of reference clock signal $CLK_{REF}$. After synchronization, the PLLs can have consistently the same phase relationship with the reference clock signal $CLK_{REF}$.

Although FIG. 3 illustrates one example implementation of a control circuit including a reset phase adjustment circuit, other configurations are possible.

In the illustrated configuration, the reference clock signal $CLK_{REF}$ is provided to the PLL 41 without division. However, in other configurations, a reference clock divider is used to divide the reference clock signal before it is provided to the PLL 41. In such a configuration, an amount that the count of the modulo-M counter 64 is incremented per cycle of the reference clock signal $CLK_{REF}$ can be based on a division rate of the reference clock divider. For example, when a division rate of the reference clock divider changes, an increment value of the modulo-M counter can be changed based on the reference clock divider's division rate.

Figure 4:
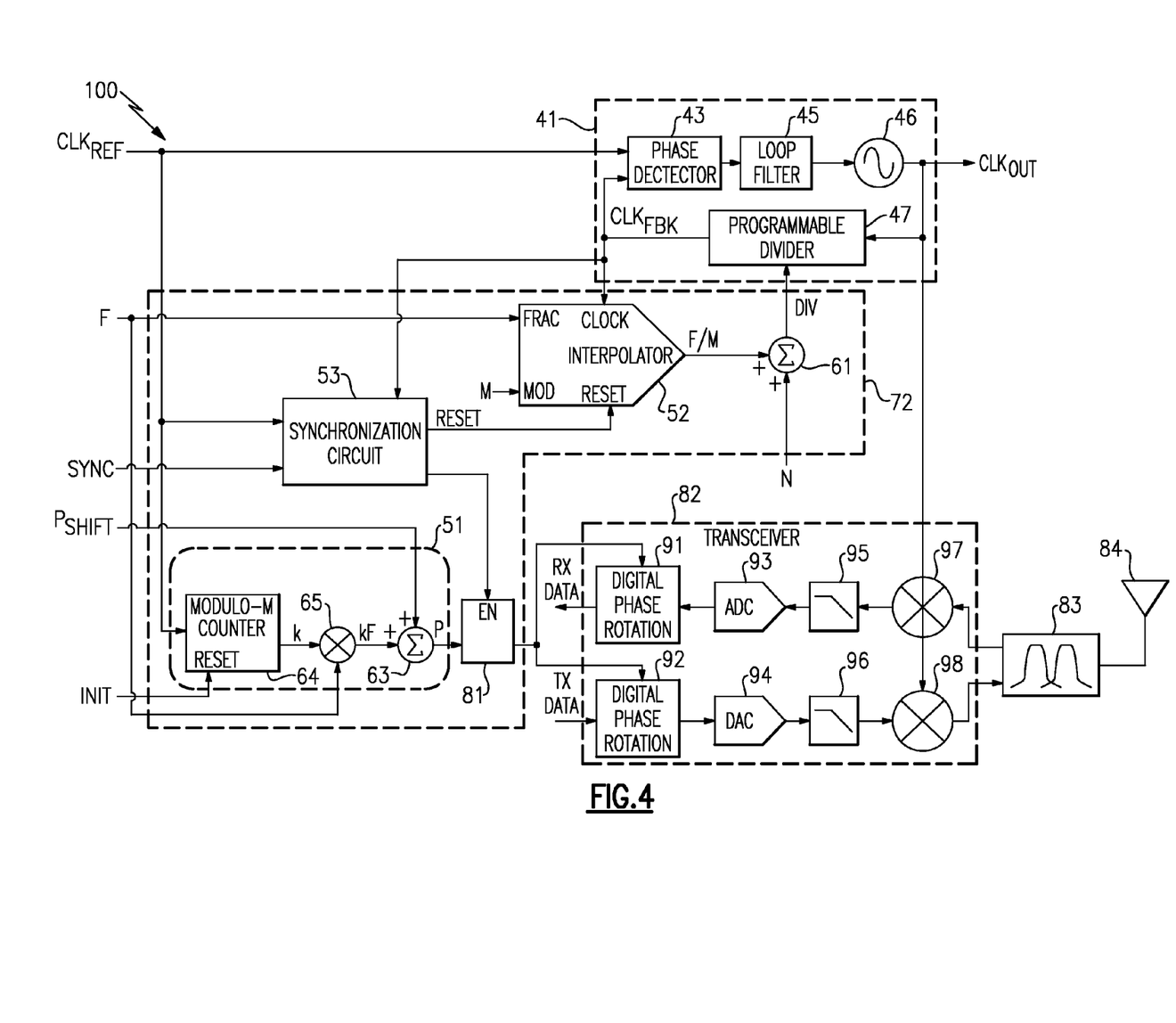
FIG. 4 is a schematic block diagram of a communications system according to one embodiment.

FIG. 4 is a schematic block diagram of a communications system 100 according to one embodiment.

The communications system 100 includes the PLL 41, the interpolator 52, the adder 61, the synchronization circuit 53, and the reset phase adjustment calculation circuit 51, which can be as described earlier. The communications system 100 further includes a state element 81, a transceiver 82, a duplexer 83, and an antenna 84.

The transceiver 82 includes a first digital phase rotation circuit 91, a second digital phase rotation circuit 92, an analog-to-digital converter (ADC) 93, a digital-to-analog converter (DAC) 94, a receive filter 95, a transmit filter 96, a first mixer 97, a second mixer 98.

The second digital phase rotation circuit 92 includes a data input that receives transmit data, a control input electrically connected to a data output of the state element 81, and a data output electrically connected to an input of the DAC 94. The transmit filter 96 includes an input electrically connected to an output of the DAC 94 and an output electrically connected to a signal input of the second mixer 98. The second mixer 98 further includes a clock input configured to receive the output clock signal $CLK_{OUT}$ and an output electrically connected to a transmit terminal of the duplexer 83. The duplexer 83 further includes an antenna terminal electrically connected to the antenna 84 and a receive terminal electrically connected to a signal input of the first mixer 97. The first mixer 97 further includes a clock input configured to receive the output clock signal $CLK_{OUT}$ and an output electrically connected to an input of the receive filter 95. The ADC 93 includes an input electrically connected to an output of the receive filter 95 and an output electrically connected to a data input of the first digital phase rotation circuit 91. The first digital phase rotation circuit 91 further includes a control input electrically connected to the data output of the state element 81 and a data output configured to generate receive data. The state element 81 further includes a data input configured to receive the phase adjustment signal P from the reset phase adjustment calculation circuit 51 and an enable input electrically connected to an output of the synchronization circuit 53.

In the illustrated communications system 100, the output clock signal $CLK_{OUT}$ generated by the PLL 41 has been used as a clock signal for upconverting data for transmission via the antenna 84 and for downconverting data received from the antenna 84.

The communications system 100 can have a total receive phase based on a combination of the phase of the receive data path and the phase of the output clock signal $CLK_{OUT}$. Additionally, the communications system 100 can have a total transmit phase based on a combination of the phase of the transmit data phase and the phase of the output clock signal $CLK_{OUT}$.

The illustrated communications system 100 can be synchronized during any period of the reference clock signal $CLK_{REF}$. However, in contrast to the fractional-N synthesizer of FIG. 3, the illustrated communications system 100 includes a different scheme for correcting for a phase error associated with synchronizing the PLL 41 during a particular reference period. For example, as shown in FIG. 4, the phase adjustment signal P is provided as in input to the state element 81. When the synchronization signal SYNC is asserted, the synchronization circuit 53 can reset the interpolator 52. Additionally, the synchronization circuit 53 can load the state element 81 with the phase adjustment signal P. For example, in one implementation, the state element 81 includes a plurality of latches and/or flip-flops configured to load the phase adjustment signal P in response to the synchronization circuit 53. The state element 81 can provide the stored phase adjustment signal P to the first and second digital phase rotation circuits 91, 92.

Thus, the illustrated configuration corrects for synchronization phase error by correcting a phase of the transmit signal path and/or receive signal path.

Although FIG. 4 illustrates one configuration of a communications system 100 in accordance with the teachings herein, other implementations are possible. For example, the transceiver 82 can include more or fewer components in the transmit path and/or receive path, or components arranged in a different implementation. For instance, the illustrated communication system 100 is implemented using an intermediate frequency sampled (IF-sampled) transceiver configuration, but the teachings herein are applicable to superheterodyne systems and zero intermediate frequency (zero-IF) systems.

Figure 5:
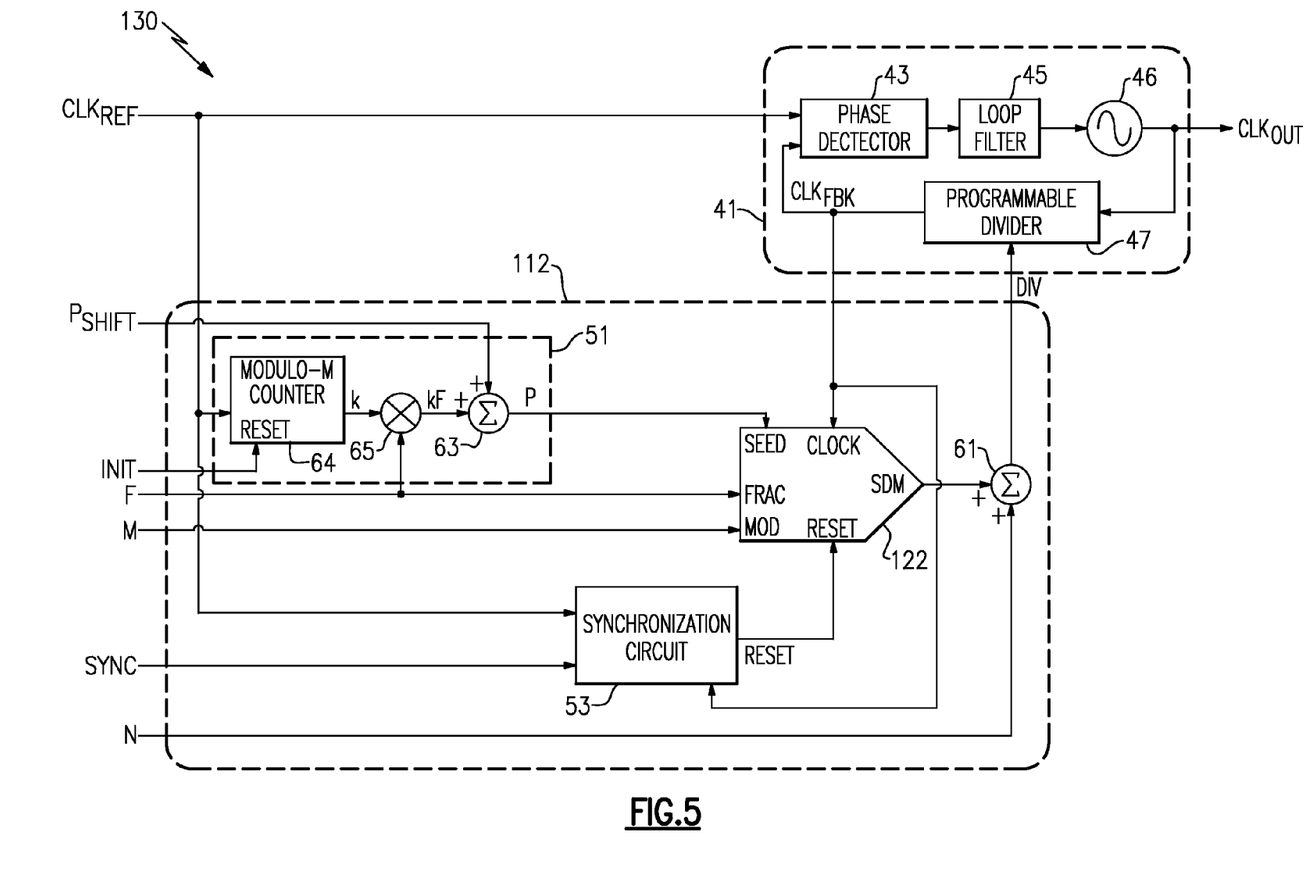
FIG. 5 is a schematic block diagram of another embodiment of a fractional-N synthesizer.

FIG. 5 is a schematic block diagram of one embodiment of a fractional-N synthesizer 130. The fractional-N synthesizer includes the PLL 41 and a control circuit 112. The control circuit 112 includes the reset phase adjustment calculation circuit 51, the first adder 61, the synchronization circuit 53, and a sigma delta modulator (SDM) interpolator 122.

The fractional-N synthesizer 130 of FIG. 5 is similar to the fractional-N synthesizer 40 of FIG. 3, except that the fractional-N synthesizer 130 includes the control circuit 112, which is implemented in a different configuration than the control circuit 42 of FIG. 3. For example, relative to the control circuit 42 of FIG. 3, the control circuit 112 of FIG. 5 omits the second adder 62 and the multiplexer 54, and includes the SDM interpolator 122 rather than the fractional interpolator 52.

As shown in FIG. 5, the SDM interpolator 122 includes a fraction numerator input that receives the fraction numerator signal F, a modulus input that receives the modulus signal M, a reset input that receives a reset signal from the synchronization circuit 53, a clock input that receives the feedback clock signal $CLK_{FBK}$, a seed input that receives the phase adjustment signal P, and an output that generates an interpolated signal for the first adder 61.

In response to activation of the synchronization signal SYNC, the synchronization circuit 53 can reset the SDM interpolator 122. Thereafter, the SDM interpolator 122 can be loaded with an integration seed or starting value corresponding to a default seed value plus the value of the phase adjustment signal P at the time of interpolator reset, or a constant number of periods after reset. Thus, in the illustrated configuration, the synchronization circuit 53 can synchronize the PLL 41 by adjusting an integration starting value of the SDM interpolator 122 by an amount indicated by the phase adjustment signal P.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
    a first phase-locked loop (PLL) configured to receive a reference clock signal and to generate an output clock signal, wherein the first PLL comprises a programmable divider configured to receive a division signal, wherein a ratio of a frequency of the output clock signal to a frequency of the reference clock signal changes in relation to the division signal;
    a first control circuit configured to generate the division signal, wherein the first control circuit comprises:
        an interpolator configured to generate an interpolated signal based on a fraction numerator signal and based on a modulus signal, wherein the first control circuit is configured to generate the division signal based on the interpolated signal;
        a reset phase adjustment calculator configured to generate a phase adjustment signal and to receive an initialization signal, wherein the reset phase adjustment calculator comprises a counter configured to count a number of periods of the reference clock signal, wherein the counter is configured to be reset by the initialization signal, and wherein the phase adjustment signal is based on a count of the counter; and a synchronization circuit configured to synchronize the first PLL in response to a synchronization signal, wherein the synchronization circuit is configured to correct for a synchronization phase error indicated by the phase adjustment signal.

2. The apparatus of claim 1, wherein the synchronization circuit is configured to correct for the synchronization phase error by adjusting a state of the interpolator by an amount indicated by the phase adjustment signal.

3. The apparatus of claim 2, wherein the synchronization circuit is further configured to reset the interpolator before adjusting the state of the interpolator.

4. The apparatus of claim 2, wherein the synchronization circuit adjusts the state of the interpolator to correct for the synchronization phase error in a single cycle of the reference clock signal.

5. The apparatus of claim 2, wherein the synchronization circuit adjusts the state of the interpolator to correct for the synchronization phase error over multiple cycles of the reference clock signal.

6. The apparatus of claim 1, further comprising a second PLL and a second control circuit configured to generate a division signal of the second PLL, wherein the second control circuit comprises a synchronization circuit and a reset phase adjustment calculator comprising a counter, wherein the initialization signal is configured to reset a count of the counter of the second control circuit.

7. The apparatus of claim 6, wherein the second control circuit is configured to synchronize the second PLL in response to the synchronization signal, and wherein an output clock signal of the second PLL and the output clock signal of the first PLL have about the same phase after synchronization.

8. The apparatus of claim 1, wherein the reset phase adjustment calculator further comprises a multiplier configured to generate a multiplied signal by multiplying the fraction numerator signal by the count of the counter.

9. The apparatus of claim 8, wherein the reset phase adjustment calculator further comprises an adder configured to generate the phase adjustment signal by adding the multiplied signal and a phase shift signal.

10. The apparatus of claim 9, wherein the first control circuit further comprises:
a multiplexer including an output, a first input configured to receive the phase adjustment signal, a second input configured to receive the fraction numerator signal, and a selection control input configured to receive a selection control signal from the synchronization circuit, wherein the interpolator includes a fraction numerator input electrically connected to an output of the multiplexer and a modulus input configured to receive the modulus signal.

11. The apparatus of claim 1, wherein the interpolator comprises a sigma delta modulator, and wherein the synchronization circuit is configured to correct for the synchronization phase error by adjusting an integration starting value of the sigma delta modulator by an amount indicated by the phase adjustment signal.

12. The apparatus of claim 1, further comprising a transceiver comprising a digital phase rotation circuit and a mixer disposed in a signal path, wherein the mixer includes a clock input configured to receive the first output clock signal, wherein the synchronization circuit is configured to correct for the synchronization phase error by adjusting a state of the digital phase rotation circuit by an amount indicated by the phase adjustment signal.

13. The apparatus of claim 12, wherein the signal path comprises a receive path, wherein the transceiver further comprises:
a receive filter including an input and an output, wherein the input of the receive filter is electrically connected to an output of the mixer; and
an analog-to-digital converter including an input electrically connected to the output of the receive filter and an output electrically connected to a data input of the digital phase rotation circuit.

14. The apparatus of claim 12, wherein the signal path comprises a transmit path, wherein the transceiver further comprises:
a digital-to-analog converter including an input electrically connected to a data output of the digital phase rotation circuit and an output; and
a transmit filter including an input electrically connected to the output of the digital-to-analog converter and an output electrically connected to a data input of the mixer.

15. The apparatus of claim 12, wherein the first control circuit further comprises a state element having a data input configured to receive the phase adjustment signal and a data output electrically connected to a control input of the digital phase rotation circuit, wherein the synchronization circuit is configured to load the state element with the phase adjustment signal in response to the synchronization signal.

16. An electronically-implemented method of clock signal generation, the method comprising:
generating an output clock signal based on a reference clock signal using a phase-locked loop (PLL);
resetting a counter using an initialization signal;
counting a number of periods of the reference clock signal using the counter;
generating a phase adjustment signal based on a count of the counter;
controlling a division signal of the PLL using an interpolator;
receiving a synchronization signal into a synchronization circuit;
synchronizing the PLL in response to a synchronization signal using the synchronization circuit; and
correcting for a synchronization phase error indicated by the phase adjustment signal using the synchronization circuit.

17. The method of claim 16, wherein synchronizing the PLL comprises adjusting a state of the interpolator by an amount indicated by the phase adjustment signal.

18. The method of claim 17, further comprising resetting the interpolator before adjusting the state of the interpolator.

19. The method of claim 16, wherein synchronizing the PLL comprises adjusting a state of the digital phase rotation circuit by an amount indicated by the phase adjustment signal.

20. The method of claim 19, further comprising:
rotating a phase of a digital receive signal using the digital phase rotation circuit.

21. The method of claim 19, further comprising:
rotating a phase of a digital transmit signal using the digital phase rotation circuit.

22. The method of claim 19, wherein synchronizing the PLL comprises adjusting an integration starting value of a sigma delta modulator of the interpolator by an amount indicated by the phase adjustment signal.

* * * * *

UNITED STATES PATENT AND TRADEMARK OFFICE
CERTIFICATE OF CORRECTION

PATENT NO. : 9,048,847 B2
APPLICATION NO. : 14/034917
DATED : June 2, 2015
INVENTOR(S) : David J. McLaurin et al.

It is certified that error appears in the above-identified patent and that said Letters Patent is hereby corrected as shown below:

Title Page 1 (item 71, Applicant) at line 1, Change "Analog Devices Technology," to --Analog Devices Global,--.

In the specification,

In column 10 at lines 2-4, Change

"$$V_{out}(t) = \cos\left(2\pi f_{ref}\left(N + \frac{F}{M}\right) + -2\pi K\left(N + \frac{F}{M}\right) + \varphi_{desired}\right)$$"

to -- $$V_{out}(t) = \cos\left(2\pi f_{ref}\left(N + \frac{F}{M}\right)t - 2\pi K\left(N + \frac{F}{M}\right) + \varphi_{desired}\right)$$ --.

Signed and Sealed this
Twenty-first Day of June, 2016

Michelle K. Lee
*Director of the United States Patent and Trademark Office*